(12) United States Patent
Cheng et al.

(10) Patent No.: US 8,901,672 B1
(45) Date of Patent: *Dec. 2, 2014

(54) TRANSISTOR HAVING ALL-AROUND SOURCE/DRAIN METAL CONTACT CHANNEL STRESSOR AND METHOD TO FABRICATE SAME

(71) Applicant: International Business Machines Corporation, Armonk, NY (US)

(72) Inventors: Kangguo Cheng, Schenectady, NY (US); Bruce B Doris, Slingerlands, NY (US); Pouya Hashemi, White Plains, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/967,461

(22) Filed: Aug. 15, 2013

Related U.S. Application Data

(63) Continuation of application No. 13/917,878, filed on Jun. 14, 2013.

(51) Int. Cl.
*H01L 21/336* (2006.01)
*H01L 29/78* (2006.01)

(52) U.S. Cl.
CPC .............. *H01L 29/785* (2013.01); *Y10S 977/89* (2013.01)
USPC ............................ 257/401; 438/283; 977/890

(58) Field of Classification Search
USPC ........................................................ 438/283
See application file for complete search history.

(56) References Cited

U.S. PATENT DOCUMENTS

| | | | |
|---|---|---|---|
| 7,253,434 B2 | 8/2007 | Golovchenko et al. | |
| 7,902,541 B2 | 3/2011 | Sekaric et al. | |
| 8,017,487 B2 | 9/2011 | Chong et al. | |
| 8,288,825 B2 | 10/2012 | Chong et al. | |
| 8,361,847 B2 | 1/2013 | Johnson et al. | |
| 2009/0104746 A1* | 4/2009 | Clifton et al. | 438/299 |
| 2011/0316044 A1 | 12/2011 | Chan et al. | |
| 2013/0049101 A1 | 2/2013 | Hsiao et al. | |

OTHER PUBLICATIONS

Najmzadeh et al., "Local Stressors to Accommodate 1.2 to 5.6 GPa Uniaxial Tensile Stress in Suspended Gate-All-Around Si Nanowire in MOSFETs by Elastic Local Buckling", ISDRS 2011, Dec. 7-9, 2011, College Park, MD, USA.

* cited by examiner

*Primary Examiner* — Alexander Ghyka
(74) *Attorney, Agent, or Firm* — Harrington & Smith; Louis J. Percello

(57) ABSTRACT

An intermediate transistor structure includes a fin structure disposed on a surface of an insulating layer. The fin structure has a gate structure disposed thereon between first and second ends of the fin structure. A first portion of the fin structure is a first doped portion that is disposed over a first recess in the surface of the insulating layer and a second portion of the fin structure is a second doped portion disposed over a second recess in the surface of the insulating layer. The intermediate transistor structure further includes source and drain metal disposed around the first and second doped portions, each inducing one of compression strain or tensile strain in a portion of the fin structure that is disposed within the gate structure and that functions during operation of the transistor as a channel of the transistor.

10 Claims, 3 Drawing Sheets

US 8,901,672 B1

TRANSISTOR HAVING ALL-AROUND SOURCE/DRAIN METAL CONTACT CHANNEL STRESSOR AND METHOD TO FABRICATE SAME

CROSS-REFERENCE TO A RELATED PATENT APPLICATION

This patent application is a continuation patent application of copending U.S. patent application Ser. No. 13/917,878, filed Jun. 14, 2013, the disclosure of which is incorporated by reference herein in its entirety.

TECHNICAL FIELD

The exemplary embodiments of this invention relate generally to semiconductor devices and fabrication techniques and, more specifically, relate to the fabrication of semiconductor transistor devices, such as those used in random access memory (RAM) and logic circuitry, having stress induced in the transistor channel. The embodiments of this invention apply, for example, to nanowire transistor devices as well as to FinFET transistor devices such as those using a silicon on insulator (SOI) substrate, such as an extremely thin SOI (ET-SOI) substrate.

BACKGROUND

In conventional substantially planar types of transistor devices a strained semiconductor layer can be used to improve transistor performance. Charge carrier mobility enhancement results from a combination of reduced effective carrier mass and reduced phonon scattering. In an n-channel metal oxide semiconductor (MOS) field effect transistor (FET) having a silicon channel improved performance can be achieved with induced biaxial tensile stress in a silicon layer along both width and length axes of an active area, or with uniaxial tensile stress along the length axis. In a p-channel MOSFET improved performance can be achieved with induced uniaxial tensile stress in the silicon layer along the width axis only (transverse tensile stress). The p-channel MOSFET can also show enhanced performance with induced uniaxial compressive stress in the top silicon layer along the length axis only (longitudinal compressive stress). Compressive stress can be provided selectively in a silicon layer, for example, by using selective epitaxial SiGe stressors in the source and drain regions of a p-channel MOSFET to induce a desired compressive stress along the length axis (longitudinal). Similarly, tensile strain can be provided, for example, by using selective epitaxial Si:C stressors in the source and drain regions of an n-channel MOSFET.

Strain engineering for three dimensional structures such as nanowires or FinFETs can be important in order to fulfill device performance requirements. However, conventional methods such as the use of an embedded source/drain (S/D) or liners are impractical for SOI FinFETs, in particular for those having small geometry gate pitches. A different approach is needed in order to further increase the strain in the channel region of the FET.

SUMMARY

In a first aspect thereof the various embodiments of this invention provide a method to fabricate a transistor. The method includes providing an elongated fin structure disposed on an insulating layer. The fin structure has a gate structure disposed thereon at a location along a length of the fin structure between a first end of the fin structure and a second end of the fin structure. The method further includes suspending a first portion of the fin structure proximate to a first side of the gate structure and a second portion of the fin structure proximate to a second side of the gate structure. The first suspended portion of the fin structure overlies a first recess formed in the insulating layer and the second suspended portion of the fin structure overlies a second recess formed in the insulating layer. The method further includes doping the first suspended portion of the fin structure and the second suspended portion of the fin structure and conformally depositing source metal around the first suspended doped portion of the fin structure within the first recess and drain metal around the second suspended doped portion of the fin structure within the second recess. The source metal and the drain metal each induce a radially directed strain force into the fin structure that transfers to a laterally directed strain force along the length of the fin structure. The laterally directed strain force induces one of compression strain or tensile strain in a portion of the fin structure that is disposed within the gate structure and that functions during operation of the transistor as a channel of the transistor.

In another aspect thereof the various embodiments of this invention provide an intermediate transistor structure that comprises an elongated fin structure disposed on a surface of an insulating layer. The fin structure has a gate structure disposed thereon at a location along a length of the fin structure between a first end of the fin structure and a second end of the fin structure. A first portion of the fin structure is a first doped portion that is disposed over a first recess in the surface of the insulating layer proximate to a first side of the gate structure. A second portion of the fin structure is a second doped portion disposed over a second recess in the surface of the insulating layer proximate to a second side of the gate structure. The intermediate transistor structure further comprises source metal disposed around the first doped portion of the fin structure within the first recess and drain metal disposed around the second doped portion of the fin structure within the second recess. The source metal and the drain metal each induce a radially directed strain force into the fin structure that transfers to a laterally directed strain force along the length of the fin structure, where the laterally directed strain force induces one of compression strain or tensile strain in a portion of the fin structure that is disposed within the gate structure and that functions during operation of the transistor as a channel of the transistor.

DETAILED DESCRIPTION

The embodiments of this invention exploit the lateral stress induced by a metal contact into the transistor channel. The embodiments of this invention suspend a fin in transistor device S/D regions and then employ an etch process to undercut and release exposed portions of the fin in the S/D regions. This step is followed by performance of a shallow epitaxy to induce and diffuse dopants into the fin in the S/D regions. S/D metal contacts are then conformally deposited around the doped fin in the S/D regions and silicided. The S/D metal induces a strain force to the fin in the S/D region which then transfers the force laterally to the channel portion of the fin. The force can be a compression force or a tension force depending of the choice of metal and deposition conditions. In the various embodiments of this invention the S/D regions of the fin can be silicided using a convention process prior to conformally depositing the S/D metal contacts.

The embodiments of this invention are described below in the context of the fabrication of a transistor device containing at least one semiconductor fin structure. However, the embodiments of this invention apply equally to transistor devices containing a nanowire structure, such as those embodying a plurality of nanowires comprised of, for example, Si or a group III-V semiconductor material having a gate-all-around architecture. As such, references below to a "fin" or a "fin structure" in the description and/or claims should be understood as encompassing any type of elongated electrically conductive member that is capable of conducting a current, that can function as a channel of a transistor device, and that can have source and drain metal-containing contacts applied thereto.

Figure 1:
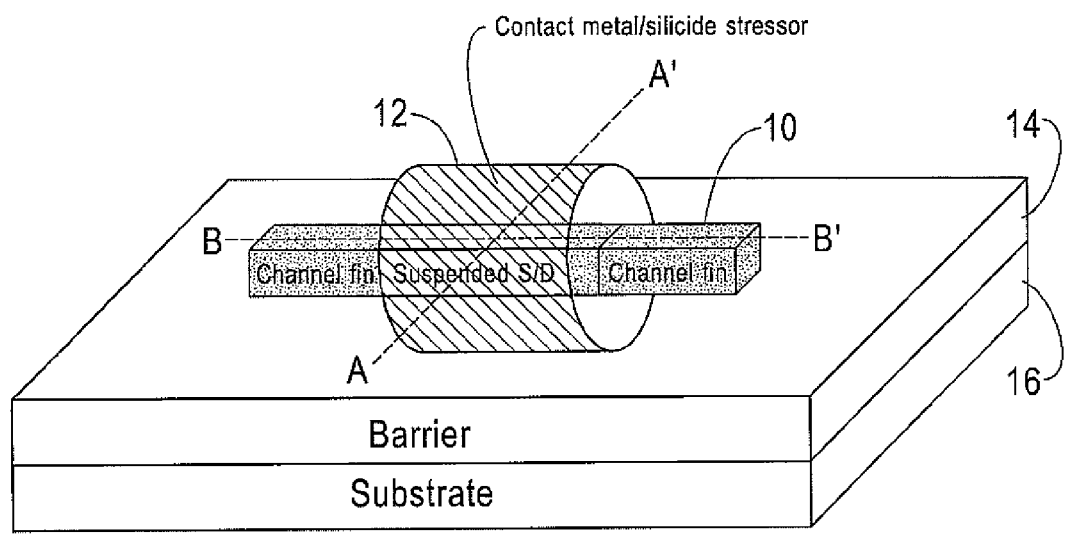
FIG. 1 shows a conceptual view of channel fin having along a length thereof a suspended S/D 12.

FIG. 1 shows a conceptual view of a fin 10 having along a length thereof one of a source or a drain (S/D) 12. The S/D 12 is suspended above and contained within a recess within an insulating dielectric or barrier layer 14 that in turn is disposed upon a major top surface of a substrate 16. The S/D 12 is comprised of a metal/silicide that is conformally deposited about the fin 10.

Figures 2A, 2B:
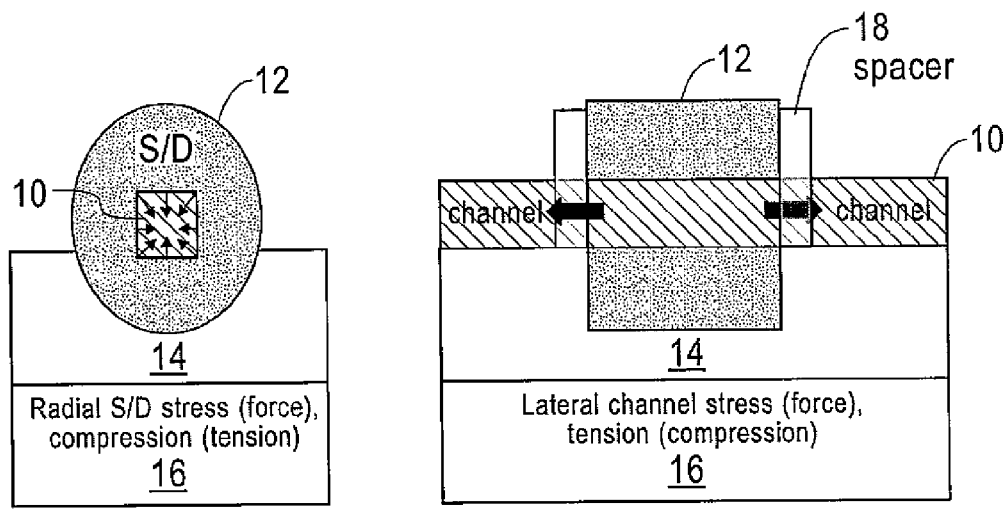
FIGS. 2A and 2B, collectively referred to as FIG. 2, illustrate a cross-sectional view of the suspended S/D taken along the section line A-A' of FIG. 1 and a cross-sectional view of the suspended S/D taken along the section line B-B' of FIG. 1, respectively.

FIG. 2A is a cross-sectional view of the S/D 12 taken along the section line A-A' of FIG. 1. FIG. 2A also shows the radial S/D stress (force) induced in the portion of the fin 10 contained within the suspended portion of the fin 10. The stress/force can be a compressive force, as illustrated, or it can be a tensile force.

FIG. 2B is a cross-sectional view of the S/D 12 taken along the section line B-B' of FIG. 1. FIG. 2B also shows dielectric spacers 18 disposed on each end of the S/D 12. FIG. 2B illustrates the radial S/D stress of FIG. 2A being transferred as a lateral (tension) channel stress (force) to a transistor channel 20. The stress/force can be a tensile force, as illustrated, or it can be a compression force.

FIGS. 3A and 3B, 4A and 4B, 5A and 5B and 6A and 6B each show an enlarged top view and a side view, respectively, of a precursor or intermediate transistor structure 30 during a fabrication process in accordance with the embodiments of this invention.

Figure 3A:
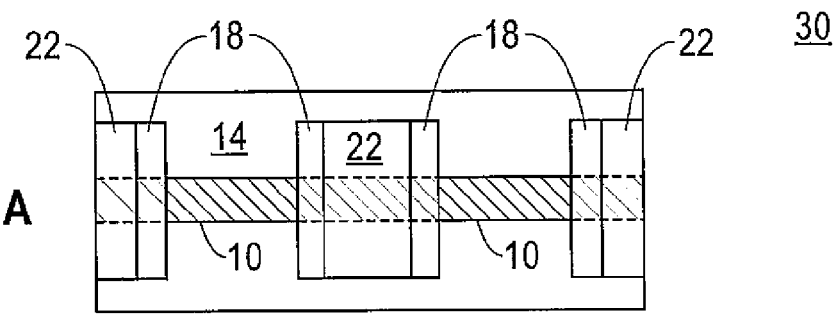
FIGS. 3A and 3B, collectively referred to as FIG. 3,
FIGS. 4A and 4B, collectively referred to as FIG. 4,
FIGS. 5A and 5B, collectively referred to as FIG. 5, and
FIGS. 6A and 6B, collectively referred to as FIG. 6, each show an enlarged (not to scale) top view and a side view, respectively, of a precursor or intermediate transistor structure during sequentially performed steps of a fabrication process in accordance with examples of the embodiments of this invention.
Figure 3B:
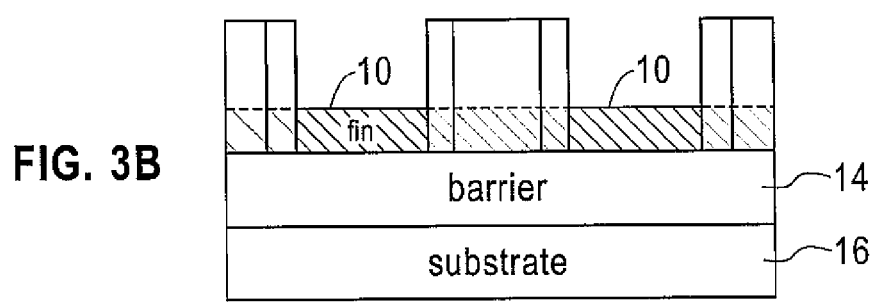
Figure 4A:
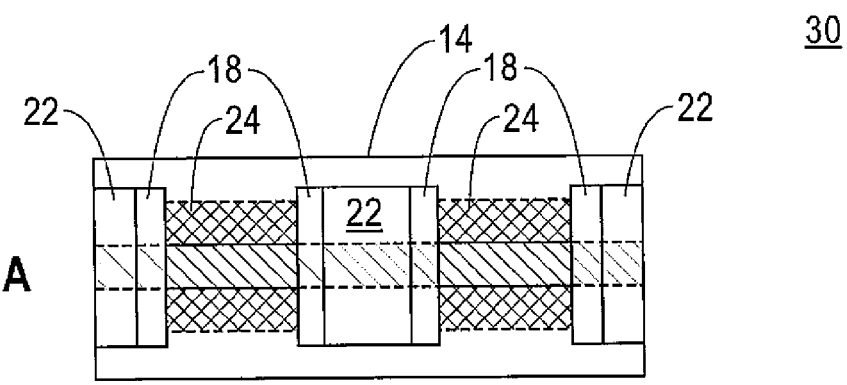
Figure 4B:
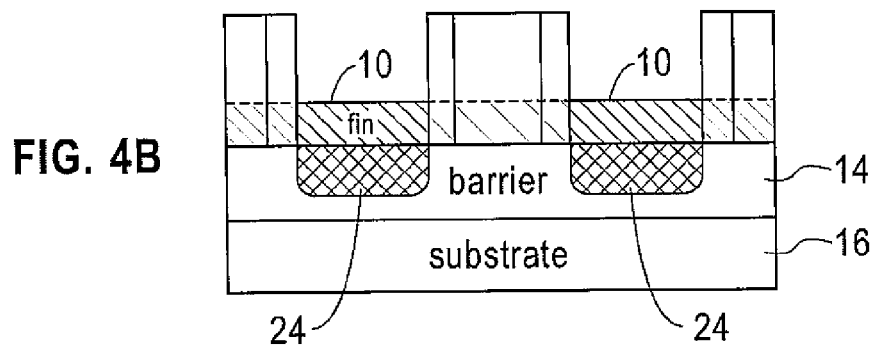
Figure 5A:
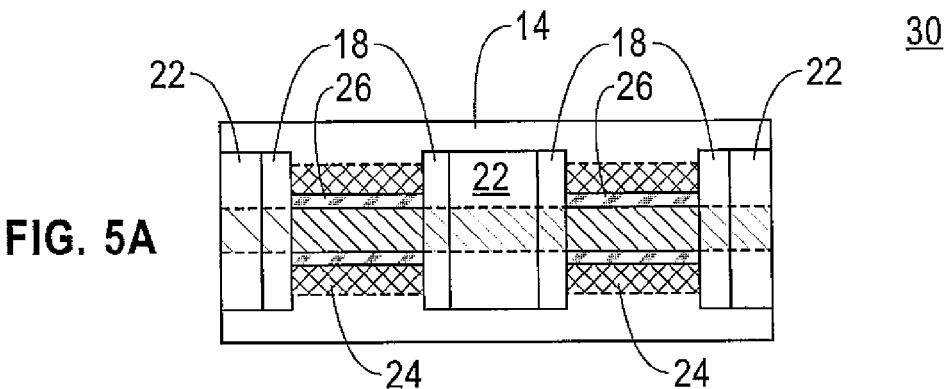
Figure 5B:
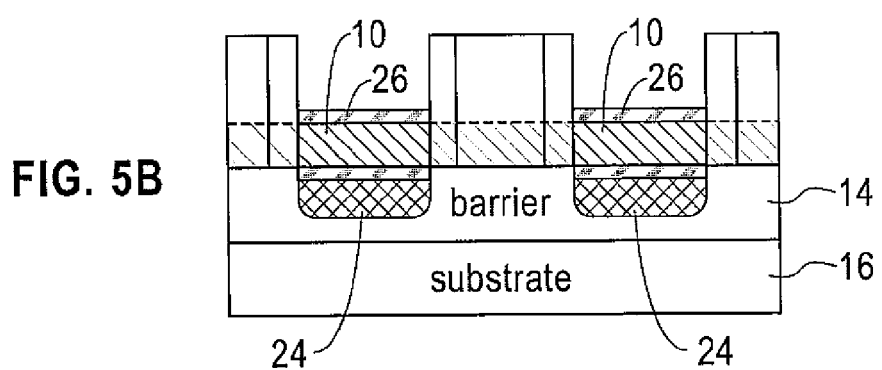
Figure 6A:
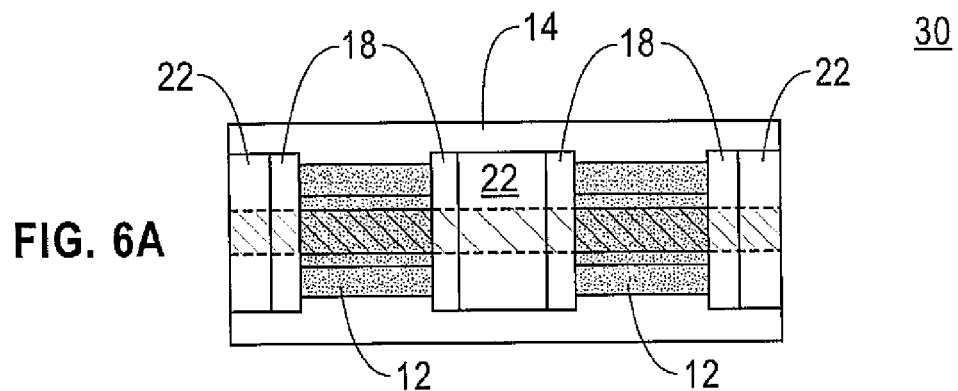
Figure 6B:
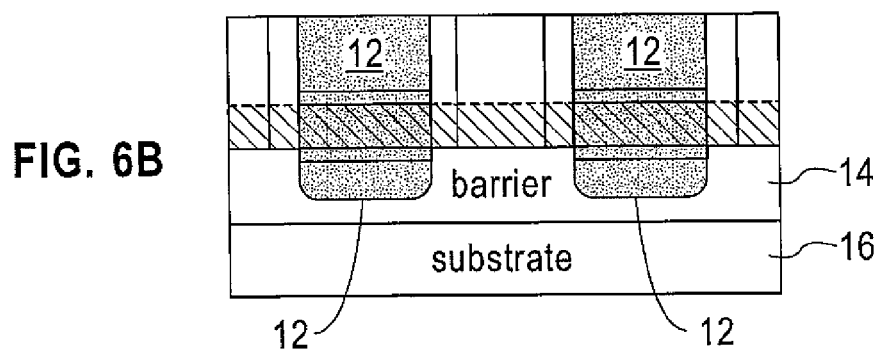

FIGS. 3A and 3B illustrate the intermediate transistor structure 30 so as to include the substrate 16 and the overlying barrier layer 14. Disposed on the barrier layer 14 is the fin 10. The substrate 16 can be any material suitable for providing mechanical support such as bulk Si or glass or a polymer. The barrier layer 14 can comprise an oxide, a high dielectric constant (high-K) material, bulk Si, SiGe, a group III-V material or, in general, any material that provides electrical isolation for the fin 10. The fin 10 can be comprised of any desired semiconductor material, for example, Si, SiGe, Ge or a group III-V compound semiconductor material as non-limiting examples.

A high-K material, if used for the barrier layer 14, can comprise a dielectric metal oxide having a dielectric constant that is greater than the dielectric constant of silicon nitride of 7.5. The high-K barrier layer 14 may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide can comprise a metal and oxygen, and optionally nitrogen and/or silicon. Exemplary high-K dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2.

In some embodiments the substrate 16, barrier layer 14 and fin 10 can comprise a part of a semiconductor-on-insulator (SOI) wafer. In this case the substrate 16 can comprise bulk silicon, the barrier layer 14 can be a buried oxide (BOX) layer and the fin 10 can be a photolithographically defined portion of an overlying semiconductor layer (e.g., a thin silicon layer). It can be noted that if one uses an ETSOI structure (e.g., 6 nm Si or less) what is obtained may be considered as a nanowire structure as opposed to a fin structure per se. It can also be noted that it is within the scope of the embodiments of this invention to suspend the fin on a bulk substrate. In this case it can be desirable to grow at least one sacrificial layer under a Silicon semiconductor layer which later is etched to suspend the fin. As should be appreciated the suspended fin 10 can be provided in various ways.

In some embodiments the barrier layer 14 could be a semi-insulating Group III-V layer or a bulk layer or a sacrificial layer or a Group IV or a Group III-V on a high-k layer.

A non-limiting example of a thickness of the barrier layer 14 can be in a range of about 15 nm to about 200 nm. The thickness of the barrier layer 14 is selected to be preferably greater than a depth of a recess 24 that is subsequently etched into the barrier layer (FIG. 4). A non-limiting example of a thickness of the fin 10 can be in a range of about 10 nm (or less) to about 40 nm (or more), with about 25 nm being one suitable nominal value. A non-limiting example of a width of the fin 10 can be in a range of about 5 nm to about 20 nm, with about 8 nm being one suitable nominal value.

The embodiments of this invention can be implemented using gate-first or gate-last processing. In the case of either the gate-first or gate-last embodiments there is thus disposed on the fin 10, at a location between first and second opposing ends of the fin 10, at least one gate structure 22. In a more preferred gate-last processing example the gate structure 22 is disposed on the top and side surfaces of the fin 10 as a sacrificial replacement gate plug or precursor structure. The gate precursor structure can comprise any suitable material such as polysilicon (poly) and can have a thickness in a range of about 20 nm to about 50 nm (the thickness is greater than the thickness of the fin 10) and a width (along the fin 10) in a range of about 10 nm to about 30 nm.

In the gate-first embodiment the gate structure 22 is formed from a desired gate electrode/metal material—examples of which can include a metal system selected from one or more of TiN, TiC, TaN, TaC, TaSiN, HfN, W, Al and Ru. The gate metal system can be selected at least in part based on the desired work function (WF) of the device (NFET or PFET), as is known. The gate metal can be deposited on the fin 10 and the surrounding surface of the barrier layer 14 by, for example, chemical vapor deposition (CVD), physical vapor deposition (PVD), or atomic layer deposition (ALD). A layer of gate dielectric material (e.g., a hi-K material or an oxide or a nitride) can be disposed between the gate metal and the fin 10.

The portion of the fin 10 contained within the gate structure 22 forms a current-conducting channel of the completed transistor device.

Disposed adjacent to ends of the gate structure 22 are the spacers 18. Spacers 18 can be formed from any suitable dielectric material such as $Si_3N_4$ and can have an exemplary thickness of about 6 nm±about 2 nm. As can be seen there is a first spacer 18 interposed between a first portion of the fin structure 10 and a first side of the gate structure 22 and a second spacer 18 interposed between a 20 second portion of the fin structure 10 and a second side of the gate structure 22.

In the non-limiting example shown in FIG. 3 there can be about a 50 nm (or less) spacing (pitch) between gate structures 22.

FIG. 4 shows a processing step to suspend the portion of the fin 10 between gate structures 22 above an undercut or recess 24. The suspended portions of the fin 10 are subsequently fabricated as the S/D structures 12 (FIGS. 5 and 6). The recess 24 can be formed by a reactive ion etch (RIE) process and/or by the use of a wet chemical etch that is selective to the material of the barrier layer 14. Prior to performing the etch process(es) the gate structures 22 can be masked. The resulting depth of the recess 24 can be selected in accordance with at least about a 1:1 ratio to the thickness of the fin 10±about 4 nm. As non-limiting examples the RIE process can use $CHF_3$ while the wet etch process can use HF. Either the RIE process or the wet etch process can be used or the two processes can be used together with one following the other. The end result is that portions of the fin 10 on the opposing sides of the gate structure 22 are suspended above the recesses 24, and the recesses 24 have a depth and a width sufficient to accommodate the thickness of subsequently deposited silicide and S/D metal as in FIG. 6.

FIG. 5 shows a result of a shallow S/D epitaxy process that forms an epitaxial layer 26 is used to induce dopants into the suspended portions of the fin 10 where the S/D structures 12 will be formed. As non-limiting examples the epitaxial layer 26 for an NFET can be phosphorus doped Si or Si:C while for a PFET the epitaxial layer 26 can be Boron doped SiGe. The dopant concentration in the epitaxial layer 26 can be in a range of about, for example, $10^{20}/cm^3$ to about $10^{21}/cm^3$. The thickness of the epitaxial layer 26 is selected so that a desired amount of dopant atoms are present during an anneal process in order to dope the underlying fin. The S/D epitaxy process can be carried out using, for example, a rapid thermal CVD process or a low pressure CVD process followed by an anneal to drive the dopant into the fin 10. For example the anneal process can be performed using a spiked rapid thermal anneal (RTA) carried out in a temperature range of about 900° C. to about 1100° C.

Thus, it can be seen that there is a layer 26 of in-situ doped epitaxially deposited semiconductor material covering a first portion of the fin structure 10 and a second portion of the fin structure 10.

FIG. 6 shows a result of the conformal deposition of silicide and S/D contact metal to form the S/D structure 12 shown in FIGS. 1 and 2. The S/D contact metal can be, as non-limiting examples, one or more of Aluminum, Vanadium, Zirconium, Niobium and Tungsten that can be deposited to exert tensile or compressive strain as discussed below. In addition certain electrically conducting metal-containing compounds might be used alone or in combination with a metal. Non-limiting examples of metal-containing compounds can include TaN, $\beta$-$Nb_2N$ (Niobium nitride) or $\delta'$-NbN. These various metals and/or metal-containing compounds can be deposited by a process, such as CVD or ALD or sputtering, that most preferably results in the conformal deposition of the S/D contact metal around the epitaxial layer 26 and a layer of silicide that covers the exposed portions of the epitaxial layer 26 that overlies the fin 10. The silicide can be formed from, as non-limiting examples, Ni, NiPt, Co, or Ti deposited using ALD followed by a thermal process carried out in a range of about 400° C. to about 500° C.±about 20° C. to form the silicide.

The result is the formation of the S/D structure 12 that completely surrounds the fin 10 (metal-all-around) and that substantially fills the recess 24 and the space between the spacers 18 up to about the top of the gate structure 22. In an embodiment the metal/silicide of the S/D structure 12 exerts a radial (inwardly) compressive force on the fin 10 that results in the fin 10 expanding along its length axis and exerting a compressive strain on that portion of that portion of the fin material contained within the gate structure 22 (on the channel of the FET). In another embodiment the metal/silicide of the S/D structure 12 exerts a radial (outwardly) force on the fin 10 that results in the fin 10 contracting along its length axis and exerting a tensile strain on that portion of that portion of the fin material contained within the gate structure 22 (on the channel of the FET). In either case the majority of the stress is induced by the deposited metal and not the silicide per se.

Various techniques can be used to deposit the metal on the S/D structures 12. As several exemplary and non-limiting examples, sputtered (magnetron dc sputtering source) Aluminum, Vanadium, Zirconium, Niobium and Tungsten can be deposited tensile or compressive depending on the sputter working pressure. Depending on the metal the pressures can slightly vary, but in general the lower the pressure the more compressive the metal will be, therefore it will impose a tensile stress on the fin or nanowire. "Low pressure" can be assumed to mean about 0.1 to about 0.5 Pa. The exact pressure values vary in accordance with the selected metal. Conversely the higher the sputter working pressure the more tensile the metal becomes, where the "higher" pressure can be assumed to mean about 0.6 to about 2 Pa. This technique would introduce a compressive strain on the fin.

For completeness the use of certain metal-containing and other conducting materials can include, as non-limiting examples, deposition (e.g., by sputtering) of TaN (Tantalum nitride) on the nanowire to place the nanowire in compressive strain and subsequently induce tensile strain in the nanowire in the gate region. Conversely sputtered $\beta$-$Nb_2N$ (Niobium nitride) can be used. Sputtered $\beta$-$Nb_2N$ (Niobium nitride) is tensile (0.8 Gpa), whereas $\delta'$-NbN is highly compressive (3.5 GPa). Different phases can be created by varying the nitrogen partial pressure during deposition.

Processing can continue, for the gate-last embodiment, to remove the sacrificial gate structure 22 and replace it with a metal gate structure/stack. For either the gate-first or gate-last embodiments the processing can then, for example, planarize the structure shown in FIG. 6 and form in a conventional fashion a layer of dielectric over the structure, such as a middle-of-line (MOL) layer. Apertures can be opened through the MOL layer and electrically conductive vias formed so as to contact the gate metal and the S/D contact metal/silicide 28. Any additional desired conventional processing can also be performed so as to complete the fabrication of an integrated circuit containing the transistor devices formed as shown in FIGS. 1-6 and explained above.

It can be appreciated that the embodiments of this invention differ from some conventional approaches where stress is induced by the use of liners/pads of a suspended nanowire. In this invention the stress can be induced in either fin or nanowire devices by use of the S/D metal contacts.

It can be further appreciated that the embodiments of this invention differ from some conventional approaches where stress is induced by epitaxial layers. In this invention the stress can be induced in either fin or nanowire devices by use of the metal contact on a suspended fin or nanowire.

It is to be understood that the exemplary embodiments discussed above with reference to FIGS. 1-6 can be used on common variants of the FET device including, e.g., FET devices with multi-fingered FIN and/or gate structures and FET devices of varying gate width and length.

Integrated circuit dies can be fabricated so as to include various devices such as a field-effect transistors, including some or all FET devices fabricated as explained above, as well as bipolar transistors, metal-oxide-semiconductor transistors, diodes, resistors, capacitors, inductors, etc. An integrated circuit in accordance with the present invention can be employed in various applications, hardware and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. An intermediate transistor structure, comprising:
    an elongated fin structure disposed on a surface of an insulating layer, the fin structure having a gate structure disposed thereon at a location along a length of the fin structure between a first end of the fin structure and a second end of the fin structure, a first portion of the fin structure being a first doped portion disposed over a first recess in the surface of the insulating layer and being proximate to a first side of the gate structure and a second portion of the fin structure being a second doped portion disposed over a second recess in the surface of the insulating layer and being proximate to a second side of the gate structure; and
    source metal disposed around the first doped portion of the fin structure within the first recess and drain metal disposed around the second doped portion of the fin structure within the second recess, the source metal and the drain metal each inducing a radially directed strain force into the fin structure that transfers to a laterally directed strain force along the length of the fin structure, where the laterally directed strain force induces one of compression strain or tensile strain in a portion of the fin structure that is disposed within the gate structure and that functions during operation of the transistor as a channel of the transistor.

2. The structure as in claim 1, where the source metal and the drain metal are selected and deposited for inducing the radially directed strain force into the fin structure.

3. The structure as in claim 1, where the gate structure is comprised of gate metal.

4. The structure as in claim 1, where the gate structure is comprised of a sacrificial gate plug.

5. The structure as in claim 1, comprising a layer of in-situ doped epitaxially deposited semiconductor material covering the first portion of the fin structure and the second portion of the fin structure.

6. The structure as in claim 5, further comprising a layer of silicide covering the layer of in-situ doped epitaxially deposited semiconductor material.

7. The structure as in claim 6, where a majority of the a total amount of radially directed strain force is determined by the source metal and drain metal.

8. The structure as in claim 1, where the first recess and the second recess are formed by one or both of a reactive ion etch and a wet chemical etch.

9. The structure as in claim 1, further comprising a first spacer interposed between the first portion of the fin structure and the first side of the gate structure and a second spacer interposed between the second portion of the fin structure and the second side of the gate structure.

10. The structure as in claim 1, where a depth of the recess is about equal to or greater than a thickness of the fin structure.

\* \* \* \* \*